US008768513B2

(12) United States Patent
Cox et al.

(10) Patent No.: US 8,768,513 B2
(45) Date of Patent: Jul. 1, 2014

(54) SYSTEMS HAVING MULTI-LINKAGE ROBOTS AND METHODS TO CORRECT POSITIONAL AND ROTATIONAL ALIGNMENT IN MULTI-LINKAGE ROBOTS

(75) Inventors: Damon Keith Cox, Round Rock, TX (US); Izya Kremerman, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 217 days.

(21) Appl. No.: 13/205,123

(22) Filed: Aug. 8, 2011

(65) Prior Publication Data

US 2013/0041505 A1 Feb. 14, 2013

(51) Int. Cl.
*G05B 19/18* (2006.01)
*G06F 19/00* (2011.01)

(52) U.S. Cl.
USPC ............... 700/254; 700/1; 700/245; 700/248; 700/246; 700/250

(58) Field of Classification Search
USPC .......... 700/245, 248, 246, 250; 414/685, 686, 414/697, 700, 704, 713, 715, 722, 723, 733, 414/917; 15/312.1, 314, 340.1; 172/272, 172/753
See application file for complete search history.

(56) References Cited

U.S. PATENT DOCUMENTS

| 5,064,340 | A | * | 11/1991 | Genov et al. ............... 414/744.5 |
| 5,534,761 | A | * | 7/1996 | Crippa ........................ 318/568.1 |
| 5,789,890 | A | | 8/1998 | Genov et al. |
| 6,059,517 | A | * | 5/2000 | Begin .......................... 414/744.6 |
| 6,105,454 | A | * | 8/2000 | Bacchi et al. ............... 74/490.03 |
| 6,491,491 | B1 | * | 12/2002 | Tsuneda et al. ............. 414/744.5 |
| 6,655,901 | B2 | | 12/2003 | Tsubota et al. |
| 6,665,901 | B2 | * | 12/2003 | Driesen et al. ............... 15/167.1 |
| 7,383,751 | B2 | * | 6/2008 | Hashimoto et al. ......... 74/490.01 |
| 2009/0024241 | A1 | * | 1/2009 | Rice et al. ....................... 700/112 |
| 2009/0182454 | A1 | * | 7/2009 | Donoso et al. ................ 700/254 |
| 2010/0019431 | A1 | * | 1/2010 | MacLeod et al. .......... 269/289 R |

FOREIGN PATENT DOCUMENTS

| JP | 10-173022 | 6/1998 |
| WO | WO 2010/080983 A2 | 7/2010 |

OTHER PUBLICATIONS

International Search Report and Written Opinion of International Patent Application No. PCT/US12/048651 mailed Feb. 1, 2013.
Brodine et al., U.S. Appl. No. 13/205,116, filed Aug. 8, 2011.
International Preliminary Report on Patentability and Written Opinion of International Patent Application No. PCT/US12/048651 mailed Feb. 20, 2014.

* cited by examiner

Primary Examiner — Ian Jen
(74) Attorney, Agent, or Firm — Dugan & Dugan, PC

(57) ABSTRACT

Methods of correction of rotational and linear misalignment in multi-link robots are provided. The method allows for precise orientation of an end effector to put or pick substrates at a target destination by correcting for both positional and rotational orientation errors. The method rotates a boom linkage to a position adjacent to the target destination, corrects for linear and rotational error by rotating a boom linkage as well as an upper arm link as well as extending or retracting a wrist member. Systems including long boom linkages are disclosed. Numerous other aspects are provided.

10 Claims, 7 Drawing Sheets

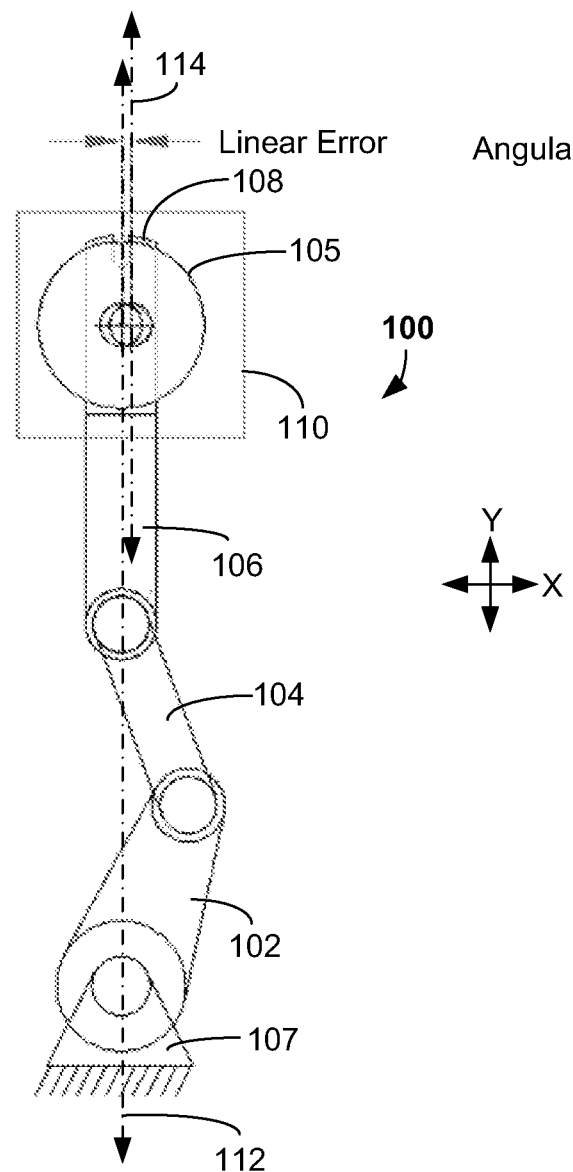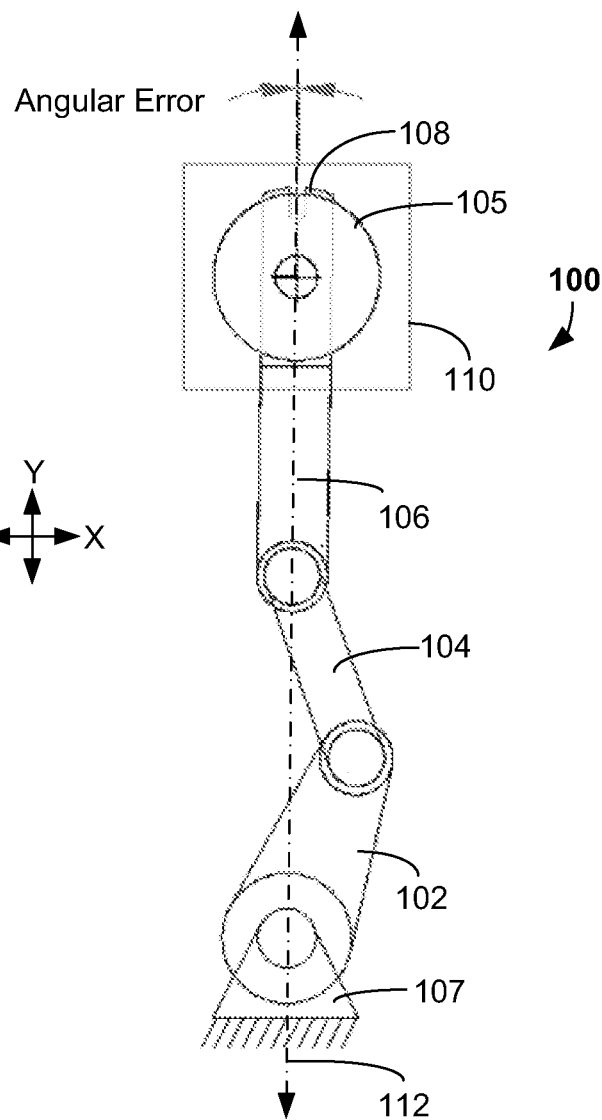
FIG. 1A
Prior Art
FIG. 1B
Prior Art

SYSTEMS HAVING MULTI-LINKAGE ROBOTS AND METHODS TO CORRECT POSITIONAL AND ROTATIONAL ALIGNMENT IN MULTI-LINKAGE ROBOTS

FIELD OF THE INVENTION

The present invention relates to methods adapted to correct alignment of robot arms in multi-link robots.

BACKGROUND OF THE INVENTION

Conventional electronic device manufacturing systems may include multiple process chambers and load lock chambers. Such chambers may be included in cluster tools where a plurality of process chambers may be distributed about a transfer chamber, for example. These systems and tools may employ articulated multi-link robots, which may be housed within the transfer chamber and transport substrates between the various process chambers and load locks. For example, the robot may transport a substrate from chamber to chamber, from load lock to chamber, and/or from chamber to load lock. Efficient and precise transport of substrates between the various system chambers may be important to system throughput, thereby lowering overall operating costs. Furthermore, precise substrate placement may improve overall processing quality. In many systems, Selective Compliant Articulated Robot Arm (SCARA) robots 100 are employed as shown in FIGS. 1A and 1B. SCARA robots 100 employ three links driven by two motors. The three links comprise an upper arm link 102, a forearm link 104, and a wrist member 106 coupled to a waist 107. An end effector 108 may be coupled to the wrist member 106 and is adapted to carry a substrate 105 to a pick or place destination such as a process chamber 110. The first motor drives the waist 107 thereby allowing overall positioning of the robot 100 in an X-Y plane. The second motor drives all the kinematically-coupled arms 102, 104, 106 such that the wrist member 106 moves linearly away from the waist 107 along a linear axis 112. Problematically, such SCARA robots 100 suffer from a compromise between positional alignment and rotational alignment. For example, due to calibration and/or manufacturing tolerances, the linear axis 112 may be offset from a normal axis 114 of the chamber 110 such as is shown in FIG. 1A. Such positional alignment between the linear axis 112 of the robot 100 and the normal axis 114 of the chamber 110 may be corrected by rotation of the entire SCARA robot 100 relative to the waist 107, but only while introducing rotational error as is shown in FIG. 1B. Likewise rotational error may be corrected, but only by introducing linear positional error. In semiconductor manufacturing, orientation of the substrate within a chamber and from chamber to chamber may be important in terms of processing quality.

Accordingly, improved methods for efficient and precise orientation of substrates are desired.

SUMMARY OF THE INVENTION

In one aspect a method of correcting misalignment in a robot is provided. The method includes providing a robot apparatus having a boom linkage, an upper arm link coupled to the boom linkage, a forearm link coupled to the upper arm link, and a wrist member coupled to the forearm link, and an end effector coupled to the wrist member; positioning the boom linkage at a location adjacent to a target location; translating the end effector to near the target location; determining an extent of offset; correcting linear positional misalignment, at least in part, by rotation of the boom linkage; and correcting rotational misalignment.

In another aspect an electronic device processing system having a multi-linkage robot apparatus is provided. The system includes a process chamber including a normal axis, the process chamber adapted to be serviced by a multi-linkage robot; the multi-linkage robot having a boom linkage rotatable about a first axis, an upper arm link coupled to the boom linkage at a second axis, a forearm link coupled to the upper arm link, a wrist member coupled to the forearm link, and an end effector coupled to the wrist member, wherein a length of the boom linkage between the first and second axes is greater than a distance between the first axis and the normal axis.

Numerous other aspects are provided in accordance with these and other aspects of the invention. Other features and aspects of the present invention will become more fully apparent from the following detailed description, the appended claims and the accompanying drawings.

BRIEF DESCRIPTION OF THE DRAWINGS

FIGS. 1A and 1B are schematic top views of a SCARA robot illustrating linear and rotational error according to the Prior Art.

DETAILED DESCRIPTION

Electronic device manufacturing may require very precise and rapid transport of substrates between various locations. In particular, it is desirable that such robots be able to be oriented precisely relative to chambers that they service (e.g., process chambers). However, as mentioned herein, conventional SCARA robots suffer from compromises between rotational and positional misalignment. Accordingly, orientation of substrates in process chambers may be less than optimal thereby providing reduced clearances or instances of improper positioning (i.e., misalignment). In particular, at the time of teaching the robot about the handoff location (for a pick or place operation) either positional error, rotational error, or both may be present. This may translate into positional or rotational error of an orientation notch used in substrate manufacture thereby imparting possible process variation. Additionally, it may reduce clearances with system components such as process chamber walls, slit valves, etc.

Accordingly, in a first aspect, the invention is a method of precisely orienting a robot wherein rotational error and positional error are both corrected.

Further details of exemplary embodiments of the invention are described with reference to FIGS. 2A-5C herein.

Figure 2A:
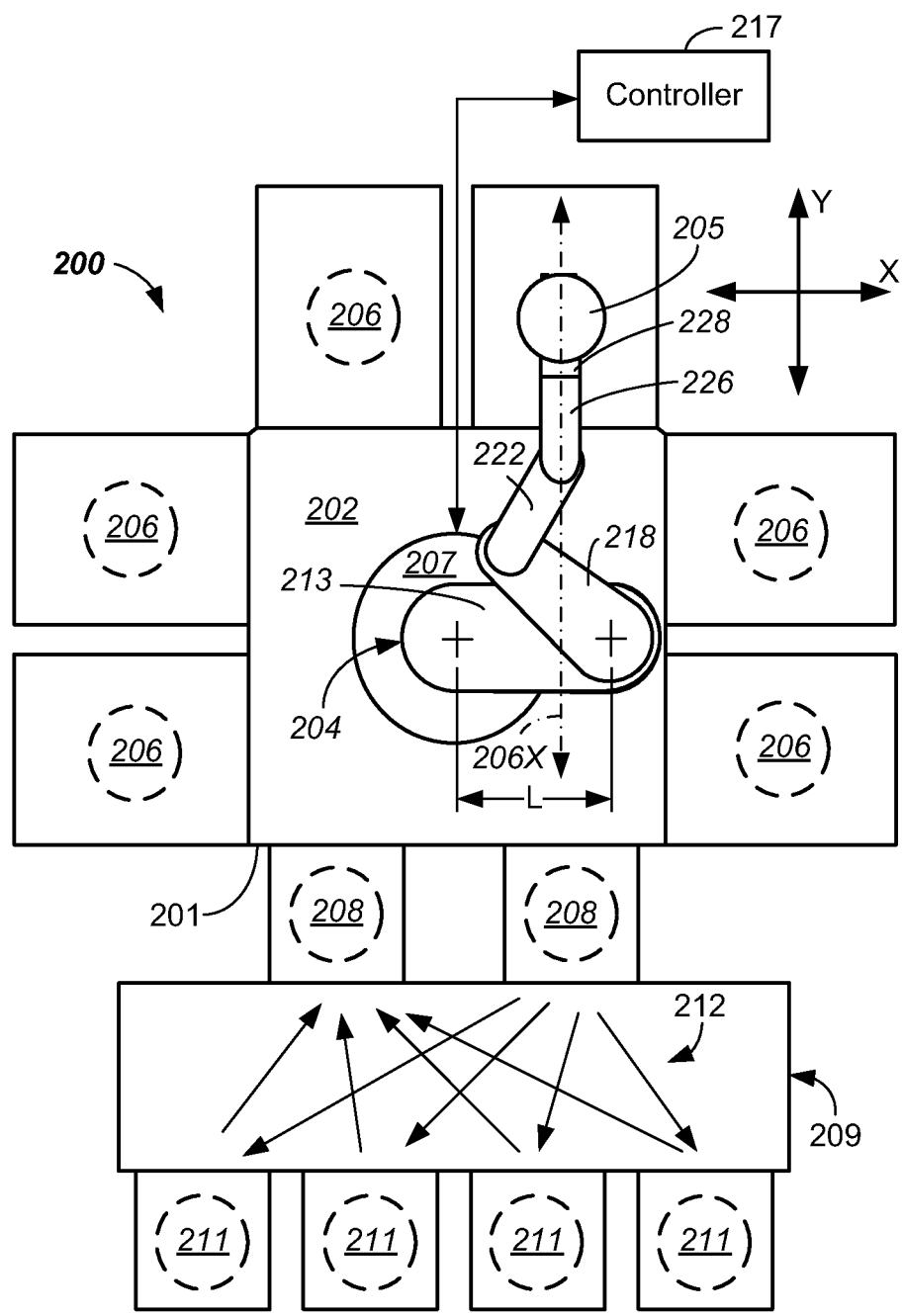
FIGS. 2A and 2B are top and isometric views, respectively, of a multi-link robot including a long boom linkage according to embodiments.
Figure 2B:
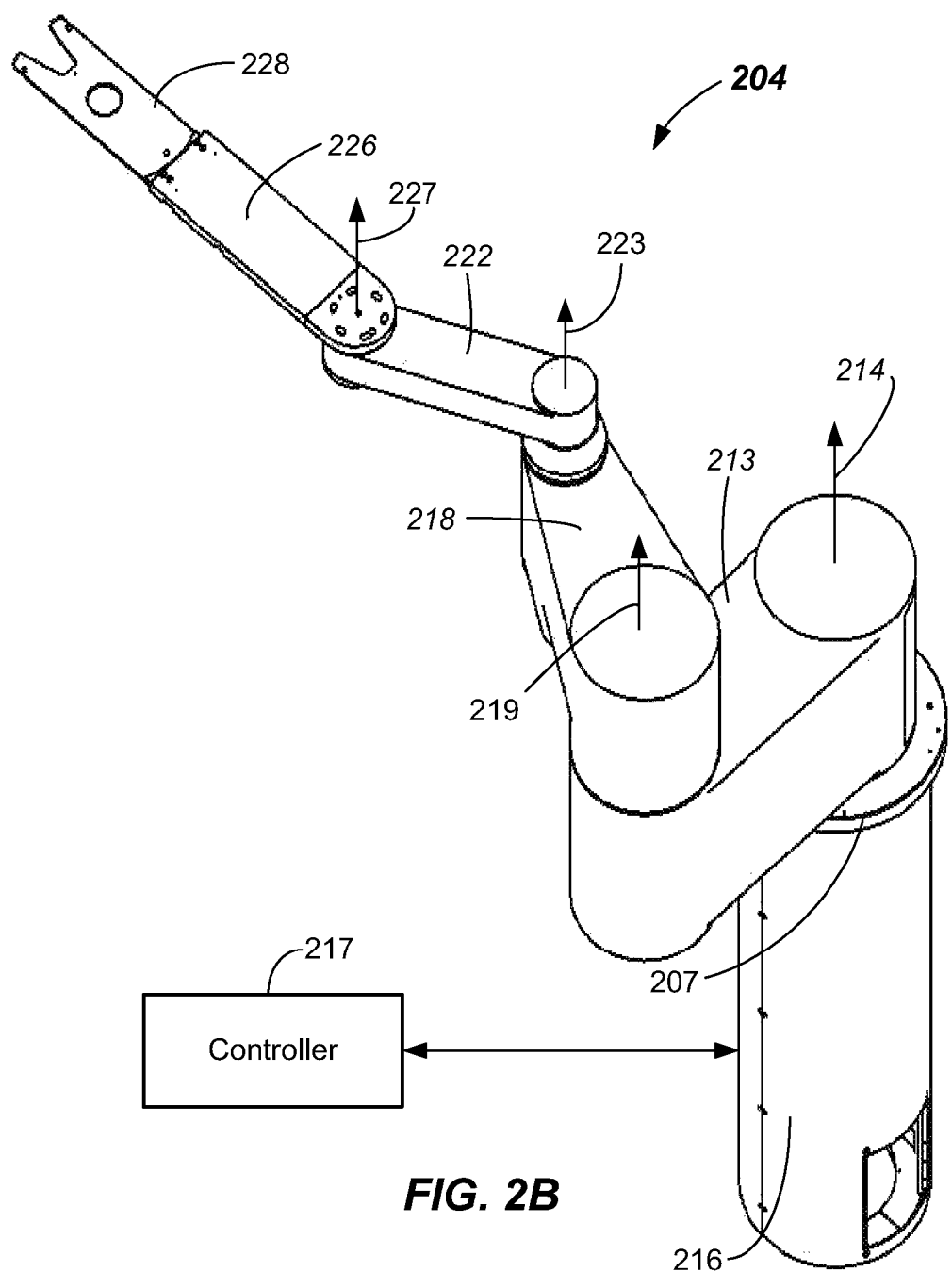

FIG. 2A-2B are diagrams of an exemplary embodiment of an electronic device processing system 200 including a multi-linkage robot apparatus 204 that may utilize or embody aspects of the present invention. The electronic device processing system 200 may be adapted to transfer substrates between various chambers (e.g., process chambers), for example. The electronic device processing system 200 includes a housing 201 including a chamber 202 (e.g., a transfer chamber). The chamber 202 may include top, bottom, and side walls and may be maintained at a suitable process vacuum, for example. A robot apparatus 204 may be received and mounted in the chamber 202 and is adapted to be operable therein.

The robot apparatus 204 may be adapted to precisely pick or place a substrate 205 mounted on an end effector 228 of the robot apparatus 204 to or from a target destination. The target destination may be an ideal placement location in one or more process chambers 206 coupled to the chamber 202. Furthermore, the robot apparatus 204 may pick or place substrates 205 from or to one or more load lock chambers 208 as the target location. The substrates 205 may be semiconductor wafers, flat panel display glass, solar cells, or other like electronic device substrates.

Chambers 206 may be process chambers adapted to carry out any number of process steps on the substrates 205, such as deposition, oxidation, nitration, etching, polishing, cleaning, lithography, or the like. The load lock chambers 208 may be adapted to interface with a factory interface 209, that may receive substrates 205 from substrate carriers 211 (e.g., Front Opening Unified Pods—FOUPs) that may be docked at load ports of the factory interface 209. Another robot (not shown) may be used to transfer substrates 205 between the substrate carriers 211 and the load lock chambers 208 as shown by arrows 212. Transfers may be carried out in any sequence or order.

The robot apparatus 204 may also include a base 207 adapted to be attached to a wall (e.g., a floor) of the chamber 202, and a boom linkage 213, which, in the depicted embodiment, is a substantially rigid cantilever beam. The boom linkage 213 may be rotated in an X-Y plane about a first rotational axis 214 in either a clockwise or counterclockwise rotational direction. The rotation about first rotational axis 214 may be provided by any suitable drive member, such as rotational motor that may be received in a motor housing 216, such as a conventional variable reluctance or permanent magnet electric motor. Other types of motors may be used. The rotation of the boom linkage 213 may be controlled by suitable commands to the first motor from a controller 217.

Mounted at an outboard end of the boom linkage 213, at a first radial position offset and spaced from the first rotational axis 214, is an upper arm link 218. The upper arm link 218 may be rotated in the X-Y plane relative to the boom linkage 213 about a second rotational axis 219 offset and spaced from the first rotational axis 214. In this embodiment, the upper arm link 218 may be independently driven by a drive motor and drive assembly (not shown) coupled to the boom linkage 213 or motor housing 216. The drive motor may be a conventional stepper motor, or a variable reluctance or permanent magnet electric motor. Other types of motors may be used. The drive assembly may comprise any suitable structure for driving the upper arm link 218. In some embodiments, the upper arm link 218 may be rotated by an extension motor (not shown) to extend the end effector 228 along an extension axis aligned with a longitudinal axis of the end effector 228. In another aspect, the upper arm link 218 may be rotated around its waist so that the upper arm link 218, forearm link 222, wrist member 226, and end effector 228 may be rotated about the waist (about axis 219) in unison.

Coupled to the upper arm link 218 at a second position spaced from the second rotational axis 219 is the forearm link 222. The forearm link 222 rotates in the X-Y plane relative to the upper arm link 218 about a third rotational axis 223 at the second position.

Located on an outboard end of the forearm link 222 at a position spaced from the third rotational axis 223 is the wrist member 226. The wrist member 226 rotates in the X-Y plane relative to the forearm link 222 about a fourth rotational axis 227. Furthermore, the wrist member 226 is adapted to couple to an end effector 228 (otherwise referred to as a "blade"), wherein the end effector 228 is adapted to carry and transport a substrate 205 during the pick and place operations. The end effector 228 may be of any suitable construction. The end effector 228 may be passive or may include some active means for holding the substrate 205 such as a mechanical clamp or electrostatic capability. The end effector 228 may be coupled to the wrist member 226 by any suitable means such as mechanical fastening, adhering, clamping, etc. Optionally, the wrist member 226 and end effector 228 may be coupled to each other by being formed as one integral piece. In some embodiments, a wrist drive assembly (not shown) may be included and adapted to allow the wrist member 226 to be independently rotated about the fourth rotational axis 227 relative to the forearm link 222.

Each of the drive motors for the boom linkage 213, upper arm link 218, and wrist member 226 may include feedback sensors to provide precise feedback of positional information to the controller 217.

In the depicted embodiment of FIG. 2A, the robot apparatus 204 is shown located and housed in a chamber 202 (e.g., a transfer chamber). However, it should be recognized that the robot apparatus 204 and method described herein, may advantageously be used in other areas of electronic device manufacturing, such as in a factory interface 209 wherein the robot apparatus 204 may transport substrates 205 between load ports of the factory interface 209 and load lock chambers 208 of the processing system, for example. The robot apparatus 204 is also capable of other transporting uses.

In operation, control signals from the controller 217 to a boom linkage drive motor (not shown) may cause rotation of the boom linkage 213 about the first axis 214. Furthermore, control signals from the controller 217 to a wrist drive motor (not shown) may cause independent rotation of the wrist member 226 and the coupled end effector 228 relative to the forearm link 222 about the rotational axis 227 and in the X-Y plane. Likewise, control signals from the controller 217 to upper arm drive motor (not shown) may cause rotation of the upper arm link 218 relative to the boom linkage 213 about the rotational axis 219 and in the X-Y plane thereby sweeping upper arm link 218, forearm link 222, and wrist member 226 in unison about second axis 219. Extension of the end effector 226 may be accomplished by an extension motor (not shown). Thus, an infinite number of transfer paths of the end effector 228 may be accomplished by the robot apparatus 204.

In some embodiments, by driving the extension motor, the forearm link 222 may be kinematically driven by the motion of the upper arm link 218. In other words, rotation of the upper arm link 218 results in a defined rotation of the forearm link 222 because the two are kinematically linked, such as by internal pulleys and belts or the like. Further descriptions of robot apparatus 204 that may utilize the present method invention may be found in WO2010/0809083 entitled "Robot Systems, Apparatus and Methods For Transporting Substrates In Electronic Device Manufacturing," filed Jul. 15, 2010, the disclosure of which is incorporated by reference herein.

Figure 3:
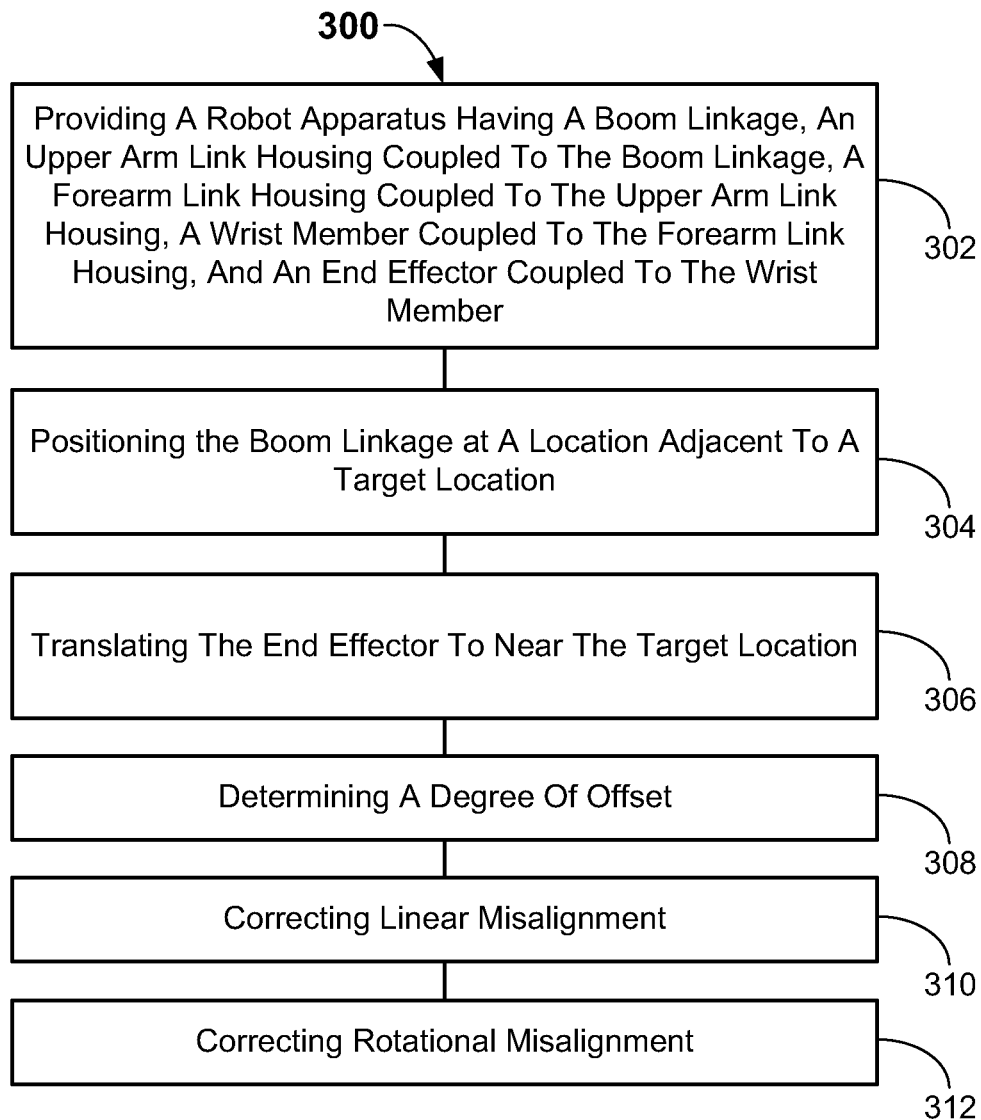
FIG. 3 is a flowchart depicting a method of correcting misalignment of a robot apparatus according to an aspect of the present invention.
Figure 4:
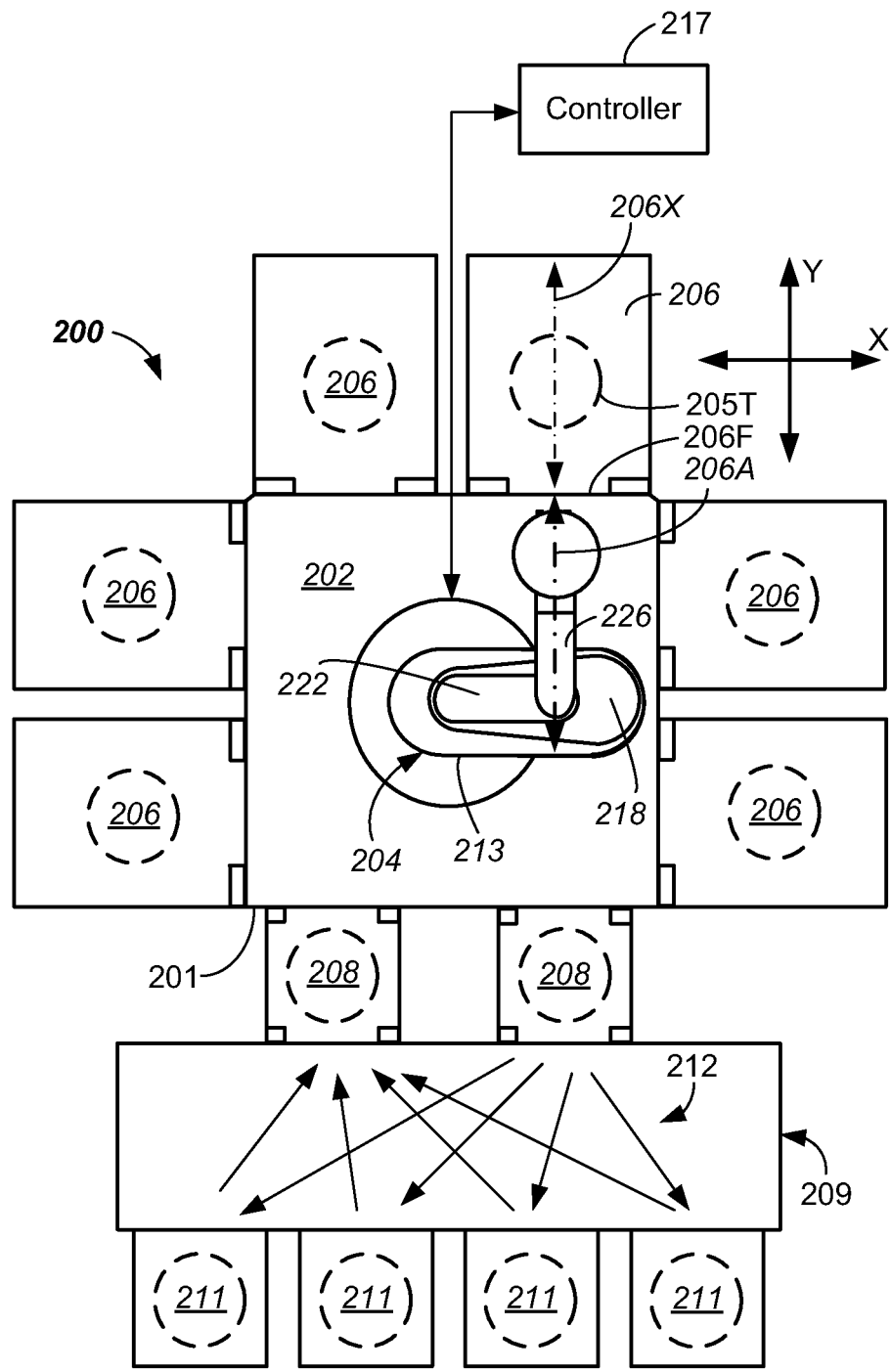
FIG. 4 is a top view of a multi-link robot including a long boom linkage positioned in front of a process chamber according to embodiments.

Now, referring in more detail to FIGS. 3 and 4, the method of correcting positional and rotational orientation of a robot apparatus 204 according to the inventive method is described. The method 300 of correcting positional and rotational misalignment in a robot apparatus 204 includes providing, in 302, a robot apparatus 204 having a boom linkage 213, an upper arm link 218 coupled to the boom linkage 213, a forearm link 222 coupled to the upper arm link 218, a wrist member 226 coupled to the forearm link, and an end effector 228 coupled to the wrist member 226 as is described with reference to FIGS. 2A-2B. The method 300 further includes, in 304, positioning the boom linkage 213 at a location adjacent to a target location (e.g., a pick or place location). The target location may be a defined ideal location in a process chamber 206, such as at a physical center thereof. In some embodiments, the boom linkage 213 will be rotated to a location adjacent to the target location 206 with the linkages 218 and 222 being retracted as shown in FIG. 4.

Figure 5A:
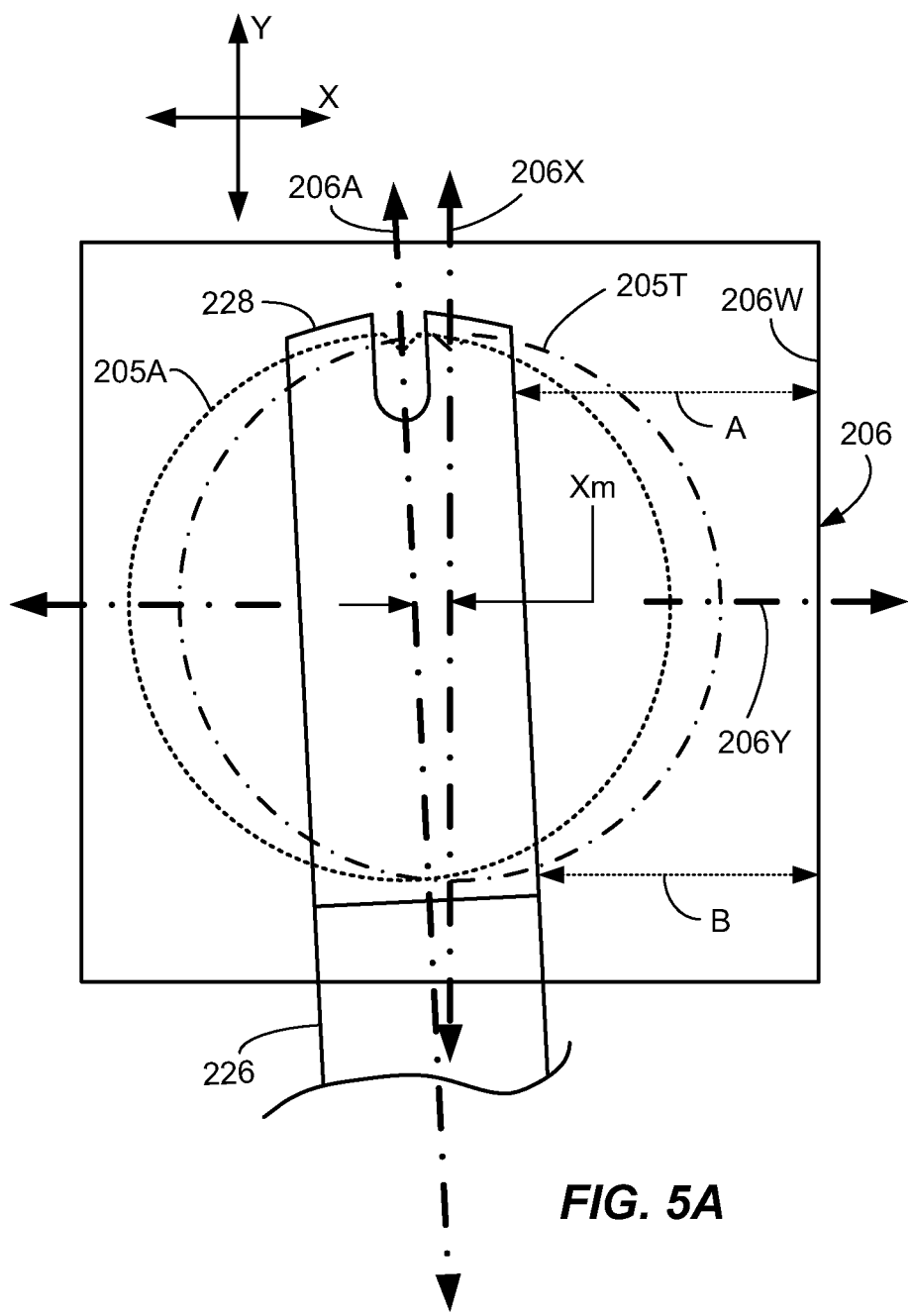
FIG. 5A is a top view of an end effector of a multi-link robot misaligned in a process chamber according to embodiments.

Then, in 306, the upper arm link 218 is rotated relative to the boom linkage 213 and the forearm link 222 is rotated and translated relative to the boom linkage 213, and the wrist member 226 is translated to position the end effector 228 near the target location 205T (See FIG. 5A). This motion is caused by action of the extension motor driving (e.g., translating) the end effector 228 into the process chamber 206 along an actual axis 206A. In the ideal case where there is no linear or rotational misalignment because the robot base 207 is perfectly aligned in the X direction with the X location of the target location 205T and perfectly rotationally aligned, no further adjustments are necessary. However, in most practical instances, when the end effector 228 is properly extended and positioned in the Y direction at near the desired target location on the Y direction (e.g., 206Y), corresponding to a theoretical Y center location for the placement of the substrate 205, there will be some linear misalignment Xm in the X direction as is shown in FIG. 5A. The linear misalignment Xm is the distance difference in the X direction between a location of a theoretical center location for the theoretical perfectly placed substrate 205T in the X direction and the location of an actual substrate 205A. To correct for the amount of linear misalignment Xm, various combinations of motions of the boom linkage 213, the wrist member 226, and/or upper arm link 218 may be undertaken.

Figure 5B:
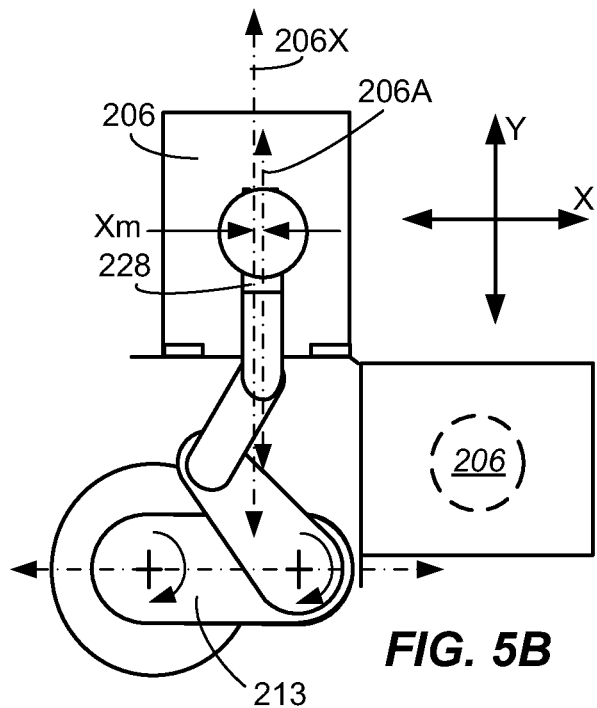
FIGS. 5B and 5C are top views of a multi-link robot at various stages in the misalignment correction method according to embodiments.
Figure 5C:
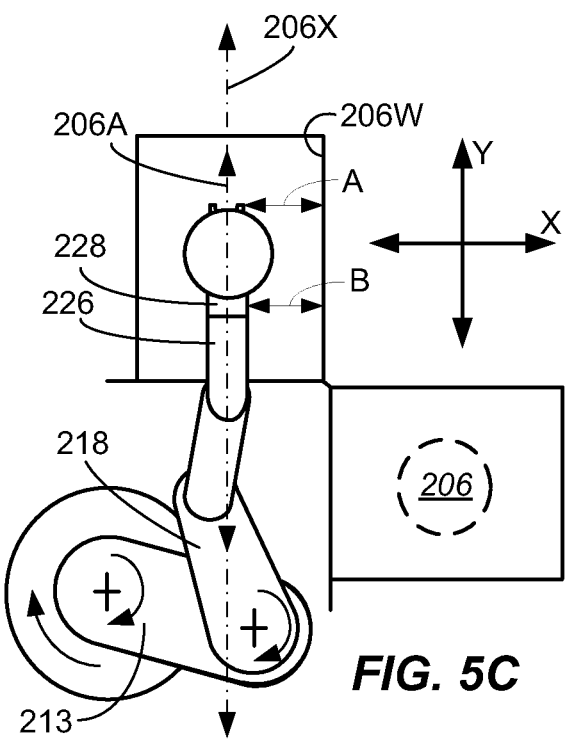

In one embodiment, correcting for linear positional misalignment Xm in the X direction may be accomplished by rotating the boom linkage 213 in a direction that will correct for the positional misalignment Xm, that is make Xm substantially equal to zero. For example, if the X position of the end effector 228 is to the right of the ideal normal axis 206X and the boom linkage 213 is positioned as shown in FIG. 5B, then the linear positional misalignment Xm in the X direction may be corrected, at least in part, by rotating the boom linkage 213 in a clockwise direction as is shown in FIG. 5C relative to the position shown in FIG. 5B. Additionally, the linear positional misalignment Xm in the X direction may be corrected, at least in part, by rotating the upper arm linkage 218 relative to the boom linkage 213. Linear positional misalignment in the Y direction may be corrected, at least in part, by extending or retracting the end effector 228 in the Y direction by rotating the upper arm linkage 218 relative to the boom linkage 213 such that the forearm link 222 and wrist member also rotate (e.g., by extension of the end effector 228 along the extension axis 206A).

In accordance with an aspect of the invention, a length L of the boom linkage 213 (See FIG. 2A) is made longer than the ideal length to align the second axis 219 with the normal axis of the process chamber 206X. In this way, deviations from nominal positions in either the +X or −X direction may be corrected. A length of the boom linkage 213 may be made longer by at least an amount equal to a maximum expected deviation (e.g., a maximum Xm) due to X axis linear misalignment.

By way of example, and referring to FIGS. 5A and 5B, one suitable correction procedure will be described. The relative order of the correction is immaterial, but following the order described herein may reduce a number of iterations required for correction of linear and rotational misalignment. First, an extent of linear misalignment Xm in the X direction is determined. This may be accomplished by measuring to determine if the actual axis 206A is to the right or left of the ideal normal axis 206X of the process chamber 206. Depending upon the degree of accuracy required, this may involve precise measurements or simply eyeball estimates. The term "X direction" is a relative term used herein. The X direction is lateral to the process chamber 206 (i.e., a direction parallel to the front facet 206F—FIG. 4), whereas the Y direction is normal to the front facet 206F of the process chamber 206 to which the correction procedure is being applied. The X and Y normal positions in the process chamber 206 are the desired positions within the chamber 206 for optimal processing (i.e., the ideal target placement locations in the X and Y directions). Once the extent of linear misalignment Xm in the X direction at the ideal placement target location is determined, the boom linkage 213 may be rotated (either clockwise or counterclockwise) until the actual axis 206A approximately aligns with the ideal normal axis 206X. Generally, at the same time, a waist motor of the upper arm link 218 will be rotated relative to the boom linkage 213, and generally in the same rotational direction about the waist axis 219. In this manner, the upper arm link 218, forearm link 222, and wrist member 226 (and coupled end effector 228) move in synchronism, sweeping through roughly the same angle of rotation as was imparted to the boom linkage 213. This generally aligns the actual axis 206A with the ideal normal axis 206X. Any remaining rotational misalignment may be corrected at this stage also. The extent of rotational misalignment may be determined by measuring a distance between a wall 206W of the process chamber 206 and the end effector 228 at multiple locations, for example at locations A and B. Additional iterations of rotation of the boom linkage 213 and sweeping of the upper arm link 218, forearm link 222, and wrist member 226 (and coupled end effector 228) in synchronism about the waist axis 219 may be required depending on the placement accuracy desired. Following this, linear misalignment in the Y direction may be corrected by extending (or retracting, as the case may be) the end effector 228 along the axis 206A by rotation of the upper arm link 218 with a SCARA extension motor (not shown). The SCARA extension motor causes the upper arm link 218 and the forearm link 222 to relatively rotate, but only translates the end effector 228 along the actual axis 206A. At this point, X and Y linear misalignment errors are corrected as is any rotational misalignment.

A method 300 of correcting misalignment will now be described with reference to FIG. 3. The alignment is carried out relative to a target location 205T that is an ideal placement location (see dotted circle 205T) where a substrate 205 is to be picked or placed within an electronic device processing system 200 (See FIG. 4). The method 300 may include, in block 302, providing a robot apparatus 204 having a boom linkage 213, an upper arm link 218 coupled to the boom linkage 213, a forearm link 222 coupled to the upper arm link 218, a wrist member 226 coupled to the forearm link 222, and an end effector 228 coupled to the wrist member 222. In block 304, the boom linkage 213 is positioned at a location adjacent to the target location 205T. For example, as is shown in FIG. 4, the boom linkage 213 is initially positioned such that the boom end having the upper arm link 218 attached is placed adjacent to the process chamber 206 (in front of) where the alignment method is being carried out relative to the target location 205T. The boom linkage 213 should be placed at a position where it will be when the robot 204 is servicing that particular process chamber 206. For example, the boom linkage 213 may be placed in front of the front facet 206F of the process chamber 206. In block 306, the end effector 228 is translated to near the target location 205T. Generally, the translation will be accomplished by rotating the upper arm link 218 and forearm link 222 with the extension motor (not shown) resulting in pure translation of the wrist member 226 and coupled end effector 228 along the actual axis 206A. The end effector 228 may be translated, generally in the Y direction, until the end effector 228 is positioned so that a hypothetical substrate carried by the end effector 228 is positioned relatively close (e.g., within a few mm) of the target location 205T. Once nominally positioned in the Y direction, an extent of offset may be determined in block 308. The extent (or degree) of offset may be determined by carrying out any suitable measurement or measurements. This may involve precise measurements or simply eyeball estimates. Offset may be made up of linear misalignment and/or rotational misalignment in the X-Y plane. For example, misalignment Xm in the X direction may be determined by measuring a distance between a wall 206W of the process chamber 206 at a defined location on the end effector 228 when the end effector 228 is placed near the target location 205T. An extent of rotational misalignment may be determined by measuring a distance between a wall 206W of the process chamber 206 and the end effector 228 at multiple spaced locations, for example at known locations A and B.

In block 310, linear positional misalignment in the X direction is corrected, at least in part, by rotation of the boom linkage 213. Generally, rotation of the boom linkage 213 is provided, and, in unison (or in sequence), a sweeping motion of the upper arm link 218, forearm link 222, and wrist member 226 about the waist axis 219 is imparted. The angle of rotation of the boom linkage 213 will roughly equal the angle of sweep of the upper arm link 218, forearm link 222, and wrist member 226 about the waist axis 219.

In block 312, any remaining rotational misalignment will be corrected, at least in part. Rotational misalignment between the actual axis 206A and the ideal normal axis 206X may be accomplished by rotation of the upper arm link 218 relative to the boom linkage 213. In particular, rotational misalignment may be accomplished by in unison sweeping of the upper arm link 218, forearm link 222, and wrist member 226 about the waist axis 219. In unison sweeping involves no relative rotation between any of the upper arm link 218, forearm link 222, and wrist member 226.

Following the correction of linear misalignment in the X direction within acceptable displacement limits, and correction of rotational misalignment within acceptable rotational limits, any remaining linear misalignment in the Y direction may be corrected for by extending (i.e., via extension) the end effector 228 in the Y direction by a suitable amount to within desired limits.

In another embodiment, the linear positional misalignment in the X direction and Y direction is first corrected, at least in part, by rotation of the boom linkage 213 alone and/or by in unison (or in sequence) sweeping motion of the upper arm link 218, forearm link 222, and wrist member 226 about the waist axis 219, and extension of the end effector 228 along the actual axis 206A until the end effector 228 is located such that a substrate 205 would be provided at the ideal location 205T. Following this correction of X and Y misalignment, self motion of the end effector 228 may be provided where any rotational misalignment is corrected by rotation of the boom linkage 213, upper arm link 218, forearm link 222, and wrist member 226 while no further X or Y motion of the end effector 228 relative to the ideal location 205T occurs. Because of the additional linkage provided by the boom linkage 213, the robot apparatus 204 may correct X and Y misalignment first and then rotational misalignment by use of self motion. Self motion is defined herein as motion of the robot apparatus 204 that does not cause any X or Y motion of the end effector 228, but only rotates the end effector 228 about the ideal location 205T.

The foregoing description discloses only example embodiments of the invention. Modifications of the above-disclosed methods which fall within the scope of the invention will be readily apparent to those of ordinary skill in the art. Accordingly, while the present invention has been disclosed in connection with example embodiments thereof, it should be understood that other embodiments may fall within the spirit and scope of the invention, as defined by the following claims.

The invention claimed is:

1. A method of correcting misalignment in a robot, comprising:
   providing a robot apparatus having a boom linkage, an upper arm link coupled to the boom linkage, a forearm link coupled to the upper arm link, and a wrist member coupled to the forearm link, and an end effector coupled to the wrist member;
   providing the upper arm link to rotate in a X-Y plane relative to the boom linkage about a second rotational axis offset and spaced from a first rotational axis, the upper arm link rotates around the second rotational axis, so the upper arm link, the forearm link, the wrist member, and the end effector rotate about the second rotational axis in unison such that in unison sweeping involves no relative rotation between the upper arm link, the forearm link, and the wrist member;
   positioning the boom linkage at a location adjacent to a target location;
   translating the end effector to near the target location;
   determining an extent of offset;
   correcting linear positional misalignment, at least in part, by rotation of the boom linkage, and
   correcting rotational misalignment.

2. The method of claim 1, comprising correcting linear positional misalignment in the X direction, at least in part, by rotating the boom linkage and rotating the upper arm link relative to the boom linkage.

3. The method of claim 1, comprising correcting rotational misalignment, at least in part, by rotation of the upper arm link relative to the boom linkage.

4. The method of claim 1, comprising correcting rotational misalignment, at least in part, by rotation of the boom linkage and rotation of the upper arm link relative to the boom linkage.

5. The method of claim 1, comprising providing a length of the boom linkage that is greater than a distance between a first rotational axis of the boom linkage and a distance in the X direction to the normal axial centerline of the process chamber.

6. The method of claim 1 comprising correcting linear positional misalignment in the Y direction, at least in part, by rotating the boom linkage and rotating the upper arm link relative to the boom linkage.

7. The method of claim 1 comprising
  correcting linear positional misalignment in an X direction and in a Y direction; and then
  correcting rotational misalignment by self motion of the robot apparatus.

8. A method of correcting misalignment in a robot, comprising:
  providing a robot apparatus having a boom linkage, an upper arm link coupled to the boom linkage, a forearm link coupled to the upper arm link, and a wrist member coupled to the forearm link, and an end effector coupled to the wrist member;
  providing the upper arm link to rotate in a X-Y plane relative to the boom linkage about a second rotational axis offset and spaced from a first rotational axis, the upper arm link rotates around the second rotational axis, so the upper arm link, the forearm link, the wrist member, and the end effector rotate about the second rotational axis in unison such that in unison sweeping involves no relative rotation between the upper arm link, the forearm link, and the wrist member;
  positioning the boom linkage at a location adjacent to a target location;
  rotating and translating the upper arm link, the forearm link, and the wrist member to position the end effector near the target location;
  determining an extent of rotational misalignment and positional misalignment in the X and Y directions;
  correcting linear positional misalignment in the X direction, at least in part, by rotation of the boom linkage and upper arm linkage relative to the boom linkage;
  correcting linear positional misalignment in the Y direction, at least in part, by extending the end effector relative to the boom linkage; and
  correcting rotational misalignment, at least in part, by rotation of the upper arm linkage relative to the boom linkage.

9. An electronic device processing system having a multi-linkage robot apparatus, comprising:
  a process chamber including a normal axis, the process chamber adapted to be serviced by a multi-linkage robot;
  the multi-linkage robot having
    a boom linkage rotatable about a first axis,
    an upper arm link coupled to the boom linkage at a second axis,
    a forearm link coupled to the upper arm link, the forearm link being kinematically driven by the motion of the upper arm link such that rotation of the upper arm link causes a defined rotation of the forearm link because of the kinematic linkage of the forearm link and the upper arm link,
    a wrist member coupled to the forearm link, and
    an end effector coupled to the wrist member,
    providing the upper arm link to rotate in a X-Y plane relative to the boom linkage about the second axis offset and spaced from the first axis, the upper arm link rotates around the second axis, so the upper arm link, the forearm link, the wrist member, and the end effector rotate about the second axis in unison,
    wherein a length of the boom linkage between the first and second axes is greater than a distance between the first axis and the normal axis.

10. An electronic device processing system having a multi-linkage robot apparatus, comprising:
  a process chamber including a normal axis, the process chamber adapted to be serviced by a multi-linkage robot;
  the multi-linkage robot having
    a boom linkage rotatable about a first axis,
    an upper arm link coupled to the boom linkage at a second axis,
    a forearm link coupled to the upper arm link, the forearm link being kinematically driven by the motion of the upper arm link such that rotation of the upper arm link causes a defined rotation of the forearm link because of the kinematic linkage of the forearm link and the upper arm link,
    a wrist member coupled to the forearm link, and
    an end effector coupled to the wrist member,
    wherein rotational misalignment is accomplished by in unison sweeping of the upper arm link, forearm link, and wrist member about the second axis, such that in unison sweeping involves no relative rotation between the upper arm link, the forearm link, and the wrist member.

* * * * *